(12) United States Patent
Jenski et al.

(10) Patent No.: US 8,781,784 B2
(45) Date of Patent: Jul. 15, 2014

(54) SYSTEM AND METHOD FOR DETECTING MISWIRING OF AN ELECTRICAL APPLIANCE

(75) Inventors: Leonard W. Jenski, Roselle, IL (US); Raymond Bambule, Naperville, IL (US); Daniel Zuzuly, Geneva, IL (US); Guy Mereness, Sycamore, IL (US)

(73) Assignee: Robertshaw Controls Company, Carol Stream, IL (US)

( * ) Notice: Subject to any disclaimer, the term of this patent is extended or adjusted under 35 U.S.C. 154(b) by 448 days.

(21) Appl. No.: 13/010,332

(22) Filed: Jan. 20, 2011

(65) Prior Publication Data

US 2012/0191399 A1    Jul. 26, 2012

(51) Int. Cl.
*G01R 1/02* (2006.01)
(52) U.S. Cl.
CPC .......................................... *G01R 1/02* (2013.01)
USPC ............................................................ 702/117
(58) Field of Classification Search
USPC ............................................................ 702/117
See application file for complete search history.

(56) References Cited

U.S. PATENT DOCUMENTS

| 5,945,797 | A | 8/1999 | Johnson |
| 6,038,114 | A | 3/2000 | Johnson |
| 6,052,265 | A * | 4/2000 | Zaretsky et al. ................ 361/42 |
| 6,184,795 | B1 | 2/2001 | Johnson |
| 6,426,603 | B1 | 7/2002 | Johnson |
| 7,130,170 | B2 | 10/2006 | Wakefield et al. |

OTHER PUBLICATIONS

Magnus Öhrström, Fast fault detection for power distribution systems, Stockholm 2003 Licentiate, Thesis Royal Institute of Technology Department of Electrical Engineering, © Magnus Öhrström, Apr. 2003, p. i-104.*

* cited by examiner

*Primary Examiner* — Tung S Lau
(74) *Attorney, Agent, or Firm* — Reinhart Boerner Van Deuren P.C.

(57) ABSTRACT

A system for detecting the miswiring of an electrical appliance that includes a microprocessor having first and second input connections to sample signals on two different electrical power lines. The microprocessor further includes a third input connection for a neutral line. In an embodiment of the invention, there is at least one switch through which electrical power can flow into a load. The at least one switch is controlled by the microprocessor. In a particular embodiment, the microprocessor is configured to compare the signals sampled at the first and second input connections to determine whether the electrical appliance has been wired correctly.

11 Claims, 2 Drawing Sheets

SYSTEM AND METHOD FOR DETECTING MISWIRING OF AN ELECTRICAL APPLIANCE

FIELD OF THE INVENTION

This invention generally relates to electrical appliances and systems for detecting miswiring of electrical appliances.

BACKGROUND OF THE INVENTION

Electrical appliances, such as those employed in the home for cooking, washing, refrigeration and the like, are, in some cases, susceptible to being wired incorrectly during assembly. Such miswiring of these appliances can result in damage to the electronic controls for the appliances, and, in some cases, can also present a shock hazard to the user. In less severe cases, the miswiring can cause the electrical appliance to perform at less than its intended capability.

It would therefore be desirable to have a system and method to detect when an electrical appliance has been wired incorrectly, to prevent operation of the appliance in such an instance, and to alert the homeowner, installation technician, or potentially even the manufacturer of the problem before any harm to the user, or any damage is done to the appliance. Embodiments of the invention provide such a system and such a method. These and other advantages of the invention, as well as additional inventive features, will be apparent from the description of the invention provided herein.

BRIEF SUMMARY OF THE INVENTION

In one aspect, embodiments of the invention provide a system for detecting the miswiring of an electrical appliance that includes a microprocessor having first and second input connections to sample signals on two different electrical power lines. The microprocessor further includes a third input connection for a neutral line. In an embodiment of the invention, there is at least one switch through which electrical power can flow into a load. The at least one switch is controlled by the microprocessor. In a particular embodiment, the microprocessor is configured to compare the signals sampled at the first and second input connections to determine whether the electrical appliance has been wired correctly.

In another aspect, embodiments of the invention provide a method for detecting the miswiring of an electrical appliance wherein the method includes the steps of sampling signals from two different electrical power lines, and determining whether the two electrical power lines are wired correctly by examining the phase relationship between the signals.

Other aspects, objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention and, together with the description, serve to explain the principles of the invention. In the drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Figure 1:
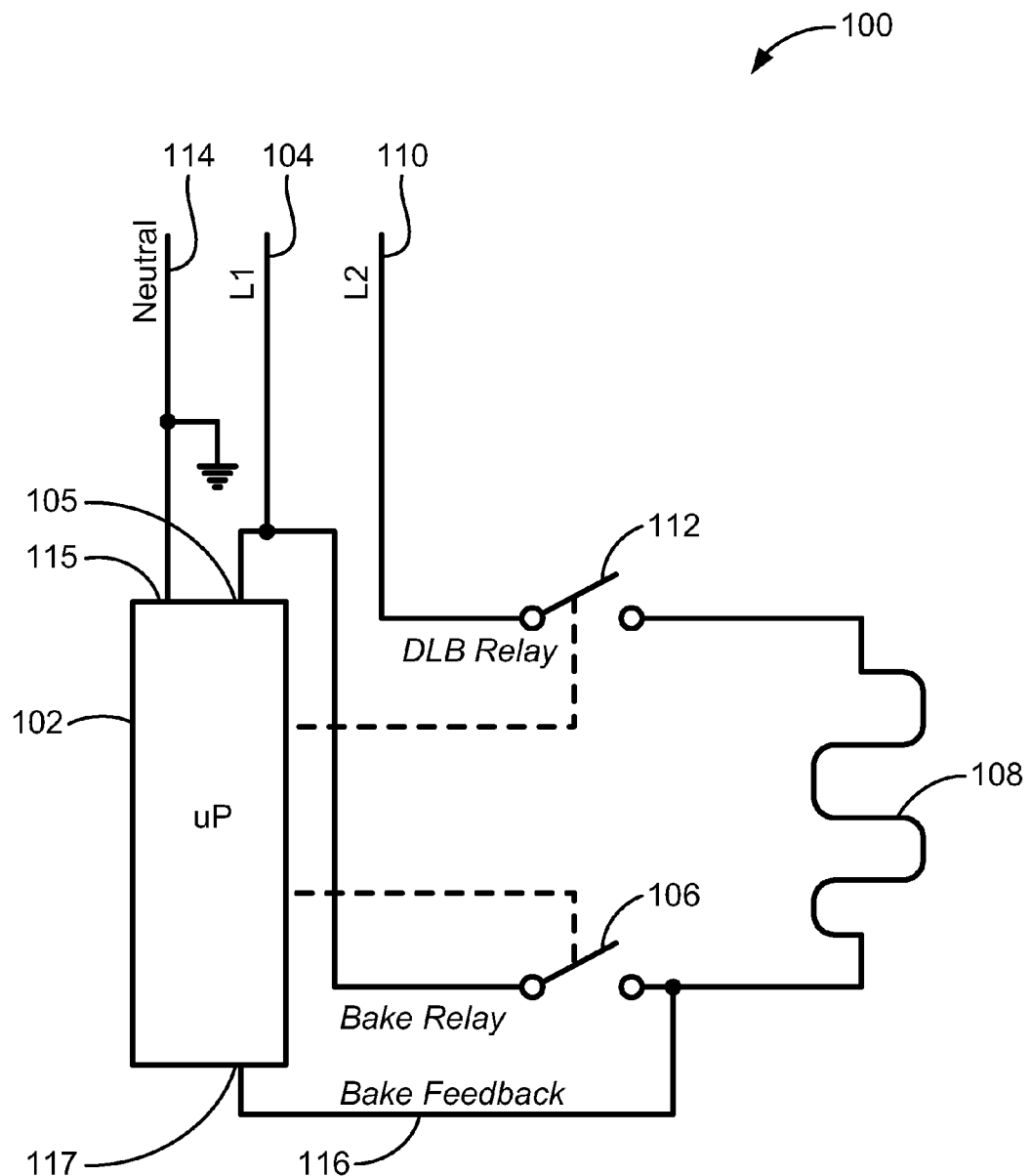
FIG. 1 is a schematic diagram illustrating a system for detecting the miswiring of an electrical appliance, according to an embodiment of the invention.

A system 100 for detecting when a household appliance (not shown) has been wired incorrectly is shown in the schematic diagram of FIG. 1. In the exemplary embodiments of the invention discussed herein, the system 100 will be described with respect to its use in an oven. However, one of ordinary skill in the art will recognize that embodiments of the invention may be employed in household appliances other than ovens.

A typical oven will have three or four power connections. In a three-connection oven requiring a 240-volt AC line voltage for example, two of the connections, commonly referred to as L1 and L2, will each carry 120 volts AC having signals that are 180 degrees out of phase. The third connection is for a Neutral line. In a four-connection oven, the fourth connection is for a ground line that is typically connected to the oven chassis. In three-connection oven, the neutral line may be connected to the oven chassis. It is possible during installation for the homeowner or installation technician to inadvertently connect the wiring for line L1 or L2 to the neutral connection and vice-versa. In this case, when the oven chassis is connected to L1 or L2 instead of neutral, there is the potential that a user coming into contact with the oven chassis may be shocked. In other instances, such miswiring, as stated above, can result in damage to electrical components in the oven.

The system 100 includes a microprocessor 102 configured to control operation of the appliance and to detect when the appliance has been wired incorrectly. The microprocessor 102 is coupled to L1 104 at first microprocessor input 105. Through this connection, the microprocessor 102 is able to sample the AC line voltage on L1 104. L1 104 is also coupled to a BAKE relay switch 106, that when closed, couples one terminal of a load 108 to L1 104. In an oven the load 108 would be a heating element. For the sake of convenience, in the following description of system 100, the load 108 will be considered to be the heating element for an oven. Thus, L2 110 is coupled to the other terminal of the heating element 108 through a double line break (DLB) switch 112. Operation of the bake relay switch 106 and the DLB switch 112 is controlled by the microprocessor 102. In the embodiment of FIG. 1, the microprocessor 102 is coupled to Neutral 114 at second microprocessor input 115 and a Bake Feedback line 116 is coupled to the microprocessor 102 at third microprocessor input 117. The Bake Feedback line 116 is also coupled to the junction between the heating element 108 and the BAKE relay switch 106.

In particular embodiments of the invention, an RC filter or voltage divider, and, typically, some additional circuitry (not shown) is used to reduce the voltage and current level of lines L1 and L2 before these signals are fed into inputs of the microprocessor 102. In a particular embodiment, the RC filter and aforementioned circuitry converts the 120-volt AC signal on L1 and L2 into a square wave having an amplitude of approximately five volts, and it is these converted signals that are monitored by the microprocessor 102. However, it is also envisioned that, in other embodiments, the RC filter may provide signals at amplitudes other than five volts, and in a format other than a square wave.

Figure 2:
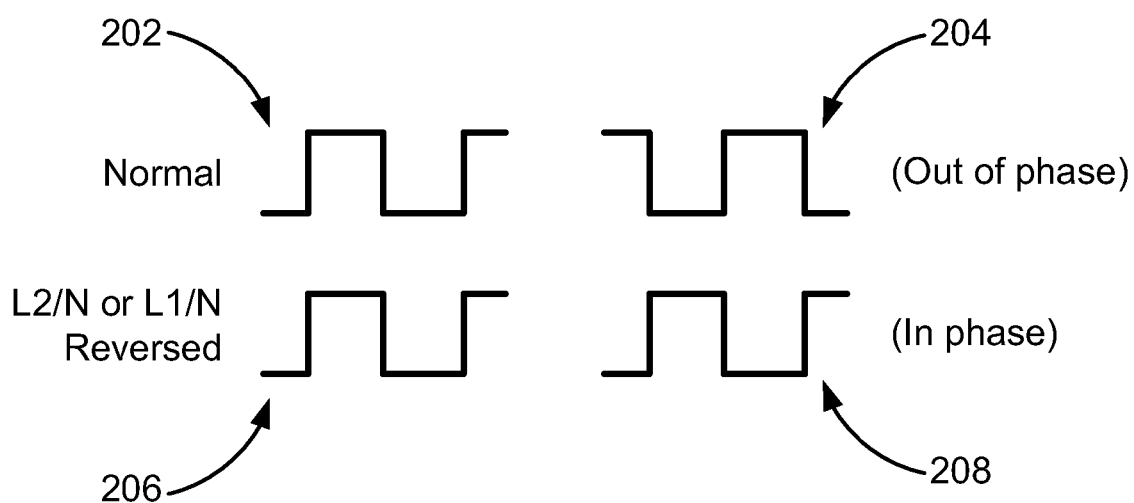
FIG. 2 is an illustration of a timing diagram showing exemplary signals as they would appear when the electrical appliance is wired correctly and when the electrical appliance is wired incorrectly.

Before startup, i.e., in the "OFF" mode, in an oven incorporating system 100, the microprocessor 102 keeps opens the BAKE relay 106 and the DLB relay 112. Thus, the heating element 108 is completely disconnected from any electrical input. After startup, the microprocessor 102 causes the DLB relay 112 to close. Thus, at startup, first microprocessor input 105 samples L1 104, while third microprocessor input 117 samples L2 110. After sampling the two power lines, the microprocessor 102 determines whether the two signals are out of phase, as would be the case if the power lines are connected correctly. FIG. 2 shows an exemplary timing diagram of the signals seen by the first microprocessor input 105 and third microprocessor input 117 when the power lines are wired correctly and incorrectly. The top two signals 202, 204 are square waves seen by the first microprocessor input 105 and third microprocessor input 117 at oven startup when the oven's power lines are wired correctly. When the signals at first microprocessor input 105 and third microprocessor input 117 are out of phase, as is the case with signals 202, 204, the microprocessor 102 determines that the oven is wired correctly, and allows for operation of the heating element 108, for example, by activating the BAKE relay switch 106.

Still referring to FIG. 2, the bottom two signals 206, 208 are square waves seen by the first microprocessor input 105 and third microprocessor input 117 at oven startup when the oven's power lines are wired incorrectly. The bottom two signals 206, 208 are seen by the first microprocessor input 105 and third microprocessor input 117 when, for example, either L1 104 is reversed with Neutral line 114 or L2 is reversed with Neutral line 114. In either case, this miswiring of the power line connections will cause the signals at first microprocessor input 105 and third microprocessor input 117 to be in phase. When the signals at first microprocessor input 105 and third microprocessor input 117 are in phase, as is the case with signals 206, 208, the microprocessor 102 determines that the oven is wired incorrectly, and opens the DLB relay 112. Because at startup the BAKE relay 106 is already open, this serves to isolate the heating element 108 and prevents operation of the oven. In at least one embodiment, at the same time, the microprocessor generates a warning to the operator that the oven is wired incorrectly.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A system for detecting the miswiring of an electrical appliance comprising:
    a microprocessor having first and second input connections to sample signals on two different electrical power lines, and a third input connection for a neutral line; and
    at least one switch through which electrical power can flow into a load, the at least one switch controlled by the microprocessor;
    wherein the microprocessor is configured to compare the signals sampled at the first and second input connections to determine whether the electrical appliance has been wired correctly.

2. The system of claim 1, wherein the microprocessor is configured to electrically isolate the load if the electrical appliance has been wired incorrectly.

3. The system of claim 1, wherein the microprocessor is configured to determine whether the electrical appliance has been wired correctly by comparing the phase relationship of signals at the first and second input connections.

4. The system of claim 1, wherein the electrical appliance is an oven, and wherein the load is a heating element.

5. The system of claim 1, wherein the microprocessor is configured to generate a warning to inform the operator that the oven is wired incorrectly.

6. The system of claim 2, wherein the at least one switch is connected to a first terminal for the load, and a second switch is coupled a second terminal for the load.

7. The system of claim 3, wherein the microprocessor determines that the electrical appliance has been wired incorrectly when the signals at the first and second input connections are in phase with each other.

8. A method for detecting the miswiring of an electrical appliance comprising the steps of:
    sampling signals from two different electrical power lines delivering power to a load, wherein the sampling comprises using a microprocessor having first and second input connections to sample signals on two different electrical power lines, and a third input connection for a neutral line; and
    determining whether the two different electrical power lines are wired correctly by examining the phase relationship between the signals.

9. The method of claim 8, further comprising disabling operation of the electrical appliance if it is determined that the two different electrical power lines are wired incorrectly.

10. The method of claim 8, wherein determining whether the two different electrical power lines are wired correctly by examining the phase relationship between the signals comprises determining that the two different electrical power lines are wired incorrectly when the signals from the two different electrical power lines are in phase with each other.

11. The method of claim 9, further comprising generating a warning for the user of the electrical appliance if it is determined that the two different electrical power lines are wired incorrectly.

\* \* \* \* \*